Figure 1:
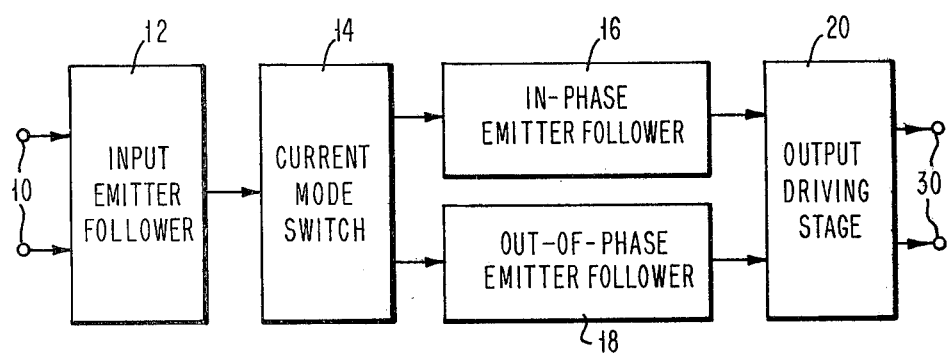

United States Patent [19]
Christopherson

[11] 4,346,312
[45] Aug. 24, 1982

[54] INTEGRATED SEMICONDUCTOR CURRENT DRIVER CIRCUITRY

[75] Inventor: Warren A. Christopherson, San Jose, Calif.

[73] Assignee: International Business Machines Corporation, Armonk, N.Y.

[21] Appl. No.: 95,756

[22] Filed: Nov. 19, 1979

Related U.S. Application Data

[63] Continuation of Ser. No. 921,142, Jun. 30, 1978, abandoned.

[51] Int. Cl.³ .................... H03K 5/01; H03K 19/003
[52] U.S. Cl. .................................. 307/270; 307/300; 307/455; 307/475
[58] Field of Search .............. 307/455, 467, 475, 300, 307/270

[56] References Cited

U.S. PATENT DOCUMENTS 3,986,045 10/1976 Lutz .............................. 307/362 X

OTHER PUBLICATIONS

E. Colao et al., "Totem-Pole Driver for High Capacitance Loads", IBM TDB, vol. 18, No. 11, Apr. 1976, pp. 3649-3650.
A. Brearley et al., "Voltage Conversion Circuit" IBM TDB, vol. 18, No. 4, Sep. 1975, pp. 1031-1032.
M. D'Agostino "High Speed Low Power Gate" RCA Technical Notes TN No. 792, Sep. 25, 1968, 2 sheets.
S. K. Wiedman, "TTL Circuit for Driving Heavy Load" IBM TDB, vol. 14, No. 5, Oct. 1971, p. 1436.
D. M. Taylor et al., "Logic Signal Level Shift Circuit" IBM TDB, vol. 12, No. 2, Jul. 1969, pp. 296-297.

*Primary Examiner*—John Zazworsky
*Attorney, Agent, or Firm*—George E. Roush

[57] ABSTRACT

This bistatic signal current driver circuit applies positively controlled drive at both signal current levels to an output open collector driver transistor by way of two substantially identical signal translating networks which track each other and compensate for variations in global base-to-emitter voltage drops, beta factors, and supply voltages. An inverted output is available merely by switching connections internally of the two networks to reverse the phase of the driving currents.

8 Claims, 2 Drawing Figures

INTEGRATED SEMICONDUCTOR CURRENT DRIVER CIRCUITRY

The instant U.S. Patent Application is a continuation of a copending U.S. Patent Application Ser. No. 921,142, filed on the 30th day of June, 1978, and abandoned upon the filing of this instant application.

The invention is related to a copending U.S. Patent Application Ser. No. 921,143, filed on the 30th day of June 1978, for "Logical Circuit Reference Electric Energy Level Generating Circuitry" thereafter issued on the 4th day of Sept. 1979 as U.S. Pat. No. 4,166,982.

FIELD OF INVENTION

The invention relates to semiconductor driver circuitry, and it particularly pertains to such circuitry for integrated semi-conductor devices of low current consumption requiring close supply voltage regulation.

BACKGROUND

Current and voltage semiconductor driver circuit devices are well known. As time passes, the need for lower power, faster, closer tolerance and lower cost circuitry arises. Others have offered particular solutions to particular problems in this problem area. Examples of the driver circuitry of the prior art that meet one or more of these criteria are to be found in the following publications:

M. D'Agostino; "HIGH SPEED LOW POWER GATE"; RCA Technical Notes; TNN. 792; Sept. 25, 1968; sheets 1,2.

D. M. Taylor and D. E. Davis; "LOGIC SIGNAL LEVEL SHIFT CIRCUIT"; IBM Technical Disclosure Bulletin; Vol. 12, No. 2; July 1969; pp. 296-7.

S. K. Wiedman; "TTL CIRCUIT FOR DRIVING HEAVY LOAD"; IBM TDB Vol. 14, No. 5; October 1971; p. 1436.

A. Brearley, S. Platt and R. Wilson; "VOLTAGE CONVERSION CIRCUIT"; IBM TDB; Vol. 18, No. 4; September 1975; pp. 1031-2; and E. Colao and E. F. Culican; "TOTEM-POLE DRIVER FOR HIGH CAPACITANCE LOADS"; IBM TDB; Vol. 18, No. 11; April 1976; pp. 3649-50.

All of these publications are directed to level shifting and/or current driving circuitry having a differential amplifying circuit in the heart thereof and using components and subcircuits in common with that of the invention. The intermediate three publications show input emitter follower circuits. Two specifically mention ease of obtaining an inversion in output polarity by internal reconnections and the latter two utilize both balanced outputs from the amplifying circuitry.

None of these publications, however, suggest the use of, or the circuit connections for, both in-phase and out-of-phase currents from the balanced amplifier for improving the drive and for compensating for undesirable variations in performance.

SUMMARY

The objects referred to indirectly hereinbefore and those that will appear as the specification progresses obtain in a simple integrated semiconductor current driver circuitry having an emitter follower input circuit coupled to a balanced amplifying circuit for driving a single-ended transistor driving circuit by way of coupling circuitry having two closely similar emitter follower and like coupling networks which apply both an in-phase voltage wave and an out-of-phase voltage wave to the input of the driving transistor and which are so designed that these networks track each other, compensating for the undesired variations, and the difference in the two current-switch output voltages ensure a net difference in the two emitter follower output currents. It is an advantage of this circuit that twice the normal signal voltage swing is available for driving the output transistor. Provisions are made for limiting the drive below a value at which the transistor otherwise would go into saturation.

The polarity of the output signal with respect to the input signal is determined by the connections of the coupling network to the output of the balanced amplifying circuit; merely interchanging the leads is all that is necessary to change the polarity.

DRAWING

Figure 2:
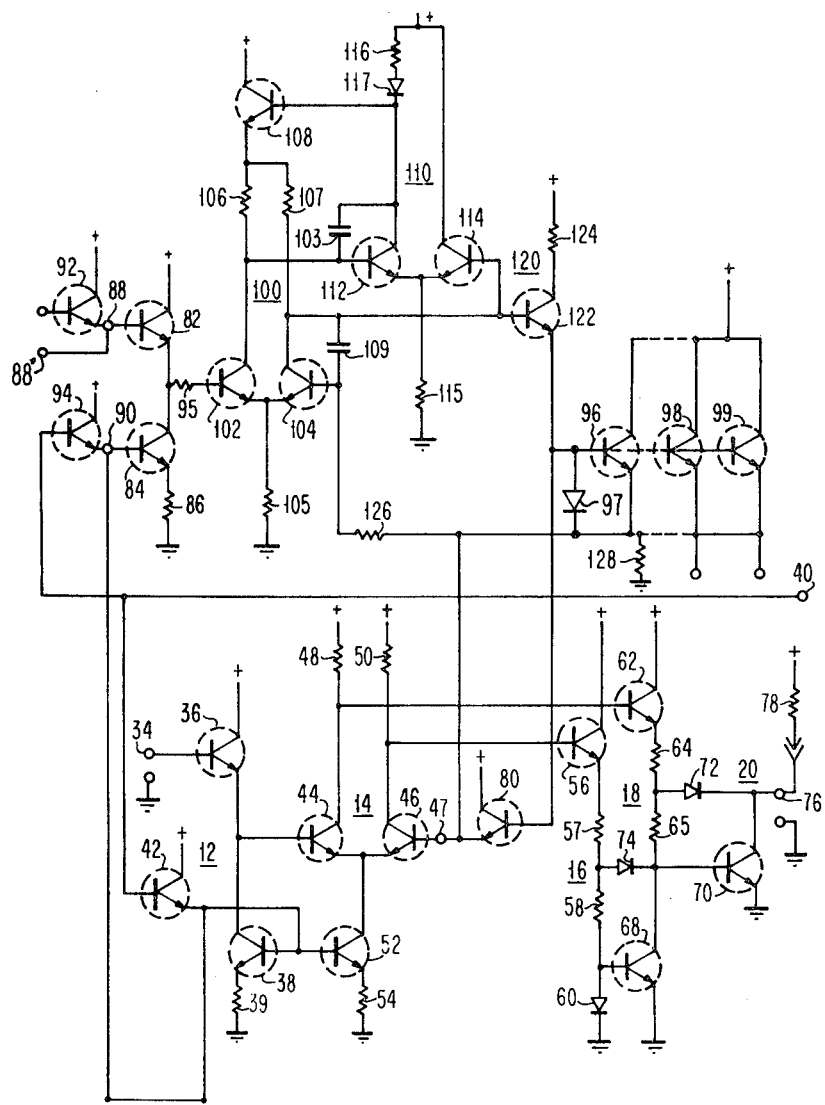

In order that full advantage obtain in the practice of the invention, a best mode embodiment thereof, given by way of example only, is described in detail hereinafter with reference to the accompanying drawing, forming a part of a specification, and in which:

FIG. 1 is a functional diagram of current driver circuitry according to the invention; and FIG. 2 is a schematic diagram of an integrated semiconductor current driver circuit according to the invention, which diagram also incorporates a schematic diagram of a voltage regulating circuit developed for use with the current driver circuit according to the invention and with like circuitry.

DESCRIPTION

The driver circuitry according to the invention comprises component subcircuits as shown in FIG. 1. A bistatic logical signal is applied at input terminals 10 of an input emitter follower circuit 12. Among other things, the input emitter follower circuit 12 effectively isolates the source of the input signal from any undue loading by the preceding driver circuitry. The output of the emitter follower circuit 12 is applied to a current mode switch circuit 14 having complementary output signal terminals individually connected to an in-phase emitter follower circuit 16 and an out-of-phase emitter follower circuit 18. Both of the latter emitter follower circuits deliver nearly identical outputs and are effective at all times in applying direct drive to an output driving stage 20 for delivering a bistatic current signal of considerable intensity to a pair of output terminals 30.

A schematic diagram of an embodiment of driver circuitry according to the invention is shown in FIG. 2, which diagram includes a novel reference voltage generating circuit which was developed concurrently with the driver circuitry of the invention. For the sake of completeness the reference level circuitry will be described briefly, but it should be understood that it is much more fully described in the copending U.S. patent application Ser. No. 921,143 hereinbefore mentioned.

REFERENCE LEVEL CIRCUITRY

This reference potential generating circuitry is laid down on the same semiconductor chip. A pair of transistors 82 and 84 have the collector-emitter circuits connected in series with a resistor 86 between a point of positive energizing potential and a point of fixed reference potential shown here as ground. The base electrodes of the transistors 82 and 84 are supplied with two regulated reference potentials supplied at input terminals 88 and 90 which are respectively connected to the emitter electrodes of transistors 92 and 94. The latter transistors are part of two distribution circuits. The junction between the emitter electrode of the transistor 82 and the collector electrode of the transistor 84 is connected by way of a resistor 95 to the base electrode of a transistor 102 of a first differential amplifying circuit 100 having another input transistor 104 having a base electrode connected to the emitter electrode of the transistor 96 through a resistor 126. A diode 97 is connected across the base-emitter circuits of the transistors 96, . . . 98 and 99. A capacitor 109 is connected between the base electrode of the transistor 104 and the collector electrode thereof.

A second differential amplifying circuit 110 has a pair of input transistors 112 and 114 having the base electrodes thereof individually connected to the collector electrodes of the transistors 102 and 104 of the first amplifying circuit 100 respectively. The base electrode of the transistor 112 is connected to the collector electrode thereof by a capacitor 103. The emitter electrodes of both transistors 112, 114 are connected to reference potential ground through a resistor 115. The collector electrode of the first transistor 112 is connected to a point of positive potential by means of series connected resistor 116 and diode 117, while the collector electrode of the other transistor 114 is connected to the same point of positive potential.

A third amplifying circuit 120 comprises a single transistor 122 having the base electrode connected to the collector electrode of the transistor 104, and having the collector electrode connected to a point of positive potential by way of a resistor 124. The emitter electrode of the transistor 122 is connected in common to the base electrodes of the regulated voltage output emitter-follower transistors 80, 96, 98 and 99. A resistor 126 is connected between the emitter electrode of the transistor 96 and the base electrode of the transistor 104, while the emitter electrodes of the transistors 96, 98, 99 among other common connected transistors 80 and the like are connected to reference potential ground by way of a resistor 128. A current source reference potential is applied to the base electrode of the transistor 84; this reference potential is obtained from another source connected to a terminal 90 as shown and distributed to circuits throughout the semiconductor chip by means of several commonly connected emitter-follower transistors 94 and 42, among others.

CURRENT DRIVER CIRCUITRY

A bistatic signal, representative of two binary logical circuit electric levels is applied at input terminals 34 of the driver circuitry according to the invention. The terminals 34 lead to the base electrode of a transistor 36 of an input emitter follower-circuit having another transistor 38 and a resistor 39. The collector-emitter circuits of the transistors and the resistor are connected in series between one point of positive energizing potential and a point of fixed reference potential shown here as ground. A source of fixed positive reference potential connected to an input terminal 40 is applied to the base electrode of an emitter-follower transistor 42 having an emitter electrode connected to the base electrode of the transistor 38. The junction of the emitter electrode of the transistor 36 and the collector electrode of the transistor 38 is connected to the base electrode of a transistor 44 forming part of a current switch circuit having another transistor 46, the emitter electrode of which is connected to the emitter electrode of the transistor 44. Resistors 48 and 50 form the loads for the transistors 44 and 46 respectively. A source of regulated voltage connected to a terminal 47 is applied to the base electrode of the transistor 46. The emitter electrodes are connected in common to the collector electrode of another transistor 52 having a resistor 54 connected between the emitter electrode and the source of fixed reference potential shown here as ground. The same reference voltage applied to the base electrode of the transistor 38 is also applied to the base electrode of the transistor 52. This reference voltage accurately controls the current in the collector circuits of the transistor 38 and the transistor 52.

The output from the transistor 46 of the current switch is applied to the base electrode of a transistor 56 forming a part of an in-phase emitter follower circuit having a resistor 57, resistor 58, and a diode 60 connected in series between the emitter electrode of the transistor 56 and the point of fixed reference potential. The output of the transistor 44 is connected to the base electrode of another transistor 62 which is a part of an out-of-phase emitter-follower circuit network of similar construction. The emitter electrode of the transistor 62 is connected in series through a resistor 64, a resistor 65, and the collector-emitter circuit of another transistor 68 to the point of fixed reference potential. All of the transistors shown are of the NPN variety and have substantially the same or at least quite similar VBE characteristics. So do all of the diodes shown, which are actually NPN transistors with base and collector electrodes interconnected.

The emitter follower circuits are connected to drive a relatively high current handling transistor 70 in the output circuit. A diode 72 is connected between the junction of resistors 64 and 65 and the collector electrode of the output transistor 70, while another diode 74 is connected between the junction of resistors 57 and 58 and the junction of the resistor 65 and the collector electrode of the transistor 68 to which the base of the output transistor 70 is also connected. Output terminals 76 are connected across the collector and emitter electrodes of the output transistor 70 with the connection to the emitter electrode preferably also being connected to a point of fixed reference potential as shown. Energizing potential for the output open collector transistor 70 is obtained externally of the driver circuit and applied through an off-chip load resistor 78 that is a part of the external circuit which is otherwise connected to the output terminal 76.

The input section is a more or less conventional low power logical emitter follower circuit. It drives a low-signal-level current switch balanced configuration. This circuit delivers twice the normal output voltage swing, and normally, the swing is limited by selecting the value of the resistor 54 in the emitter lead of the transistor 52 to maintain the transistors 44 and 46 below saturation.

The coupling circuitry comprising the two emitter follower circuits are substantially identical, and are designed to track each other and thereby compensate for the variations in base-to-emitter voltage and beta brought about by global distribution on the chip and the like. The difference in the two current-switch output voltages insure a net difference in the two emitter follower output currents. A current mirror on the in-phase emitter follower output network is used to drive the base of the output transistor 70 on the difference in emitter follower current. One polarity of the input signal drives the output transistor 70 on and the opposite polarity drives it off.

The current flowing through the transistor 68 is equal to that flowing through the diode 60; in this arrangement the circuit containing the transistor 68 is frequently termed a "current mirror". The current flowing through the collector emitter circuit of the transistor 68 is conducted away from the base of the transistor 70, whereas the current flowing through the resistor 65 tends to conduct toward the base of the transistor 70. It is the difference in the two currents that drives into the base of the transistor 70. This difference current will be conducting into or out of the base of the transistor 70 depending on whether the current flowing through the resistor 65 is greater than or less than the current in the resistor 58, the latter of which current approximates the current flowing through the diode 60 except for a small additional current flowing through the base-emitter circuit of the transistor 68.

When the transistor 44 is conducting $$I_{65} = (V_{cc} - \Delta V_S - 2 V_{BE})/(R_{64} + R_{65}) \quad (1)$$

$$I_{58} = (V_{cc} - 2 V_{BE})/(R_{57} + R_{58}) \quad (2)$$

Where
$I_{58}$ is the current in the resistor 58 in ma;
$I_{65}$ is the current in the resistor 65 in ma;
$R_{57}$ is the resistance of the resistor 57 in Kilohms;
$R_{58}$ is the resistance of the resistor 58 in Kilohms;
$R_{64}$ is the resistance of the resistor 64 in Kilohms;
$R_{65}$ is the resistance of the resistor 65 in Kilohms;
$V_{cc}$ is the supply potential in volts
$V_{BE}$ is the base-emitter drop of any of the transistors or diodes in volts; and
$V_s$ is the signal swing in volts, and
$\Delta V_s$ is the change in signal swing in volts.
Preferably $$R_{57} + R_{58} = R_{64} + R_{65}; \quad (3)$$

then $$I_{65} - I_{58} = \pm \Delta V_s/(R_{57} + R_{58}) \quad (4)$$

the choice of sign depending on the polarity of the signal $V_s$.

Thus one polarity of signal drives the transistor 70 into conduction and the opposite polarity of signal drives it off. Substantially the same value of base current flows in both instances. This current is made as large as required by adjusting the values of the resistors.

Note that whatever the magnitude of the base drive is for the transistor 70, the available current driving it into conduction will equal the available current for turning it off. Thus the balanced "push-pull" action tends to cause equal "turn on" and "turn off" transitions in the output collector current waveform of the transistor 70. This is often a desirable feature of circuit operation.

Note also that the current driving the base of the transistor 70 is independent of the $V_{BE}$ drop in a given semiconductor chip where all the $V_{BE}$ drops are substantially equal by design. The current then is also independent of variations in the supply voltage.

The diode 72 does not conduct until the transistor 70 is fully conducting. The diode 72 then conducts to prevent excess current from being driven into the base electrode of the transistor 70 and thereby driving the transistor 70 into saturation, which condition would slow the subsequent control of the transistor 70. The diode 74 performs a similar function for the transistor 68 which will be driven into conduction at the same time that the transistor 70 is being driven out of conduction.

The resistors 64 and 65 alternatively are combined into one where the diode 72 is replaced by a Schottky barrier diode from the base-to-collector of the transistor 70. Similarly, the resistors 57 and 58 are combined as long as the diode 74 is replaced by another Schottky barrier diode from the base-to-collector of the transistor 68.

An advantageous feature of this circuit is the use of the reference voltage at the terminal 47 to turn off the output transistor 70. A silicon chip and circuitry, of which typically several devices such as this are a part, is often part of a larger circuit not on the chip which is connected to the output terminal 76. For testing the larger circuit, it is often desirable to cause all devices used, such as this one, to turn off. The output transistor 70 should not be conducting. This is readily accomplished for such devices on one chip by causing the reference voltage at the terminal 47 to decrease by the amount of the logical signal swing, in this case about 0.55 volts. Such a downward signal shift causes the current in the current switch 14 to flow in the transistor 44, irrespective of which polarity of signal is applied at the input terminal 34. Then the base of the transistor 62 is lower than the base of the transistor 56 so that according to the previous explanation of circuit operation, current will be drawn out of the base of the output transistor 70 to turn it off.

Since the control for doing this is the voltage at the terminal 47 which is common to all driver circuits on the chip, all such devices will be turned off. The control of the voltage at the terminal 47 is accomplished by controlling the reference input voltage for the upper level reference circuit. This upper level reference potential is applied at the terminal 88' and is reduced for turning off the output transistor 70 due to the effect at the terminal 47 and the base electrode of the reference transistor 46 which affects the output transistor 70; that is, reducing by 0.55 volts the output of the regulator will drop a corresponding amount. This output drives the input to the lower signal voltage reference regulator at a terminal 88, which then also decreases its output voltage by 0.55 volts as required to turn off the driver 70. Thus, as discussed above, the control of the input to the upper reference is preferably connected to a chip carrier output terminal so that the necessary voltage reduction of 0.55 volts can be accomplished by circuitry external to the chip.

This overall level shifting and current driving circuit configuration provides a positive and rapid drive for both on and off transitions of the signal wave. It is inherently more efficient than the single-ended designs in the prior art.

While the invention has been described in terms of an express preferred embodiment thereof, it should be clearly understood that those skilled in the art will make changes in the circuitry without departing from the spirit and scope of the invention as defined in the appended claims concluding the specification.

The invention claimed is:

1. Integrated semiconductor current driver circuitry comprising
   an output transistor having a collector electrode connected to an output terminal, having another electrode connected to a point of fixed reference potential, and having a further electrode, a current switching circuit having one input terminal connected to a source of bistatic signal voltage, having another input terminal connected to a source of regulated reference potential, and having a pair of complementary output terminals, a pair of emitter follower circuits having input terminals connected individually to said complementary output terminals of said current switching circuit and having complementary output terminals, and one diode connected between said output terminal of one of said emitter follower circuits and said collector electrode of said output transistor, another diode connected directly between said output terminal of the other of said emitter follower circuits and said further electrode of said output transistor, a further diode connected to said other of said emitter follower circuits and to said point of fixed reference potential, and an electric connection between said further electrode of said output transistor and said output terminal of said one emitter follower circuit.

2. Integrated semiconductor current driver circuitry, comprising input terminals at which an electric wave signal of given cycle is applied, output terminals, an output transistor having a collector electrode and an emitter electrode individually connected to said output terminals and having a base electrode, a current switch circuit comprising a pair of transistors having emitter electrodes connected in common, having collector electrodes and like load resistors connected thereto, and having individual base electrodes, circuitry for applying fixed reference potential to one of said base electrodes for applying fixed energizing potential to said load resistors, and for applying other fixed reference potential to said common connected emitter electrodes, input circuitry connected between said input terminals and the other of said base electrodes for conveying said electric wave signal to said switch circuit, and emitter follower and current mirror circuitry connected between said load resistors of said current switch circuit and collector and base electrodes of said output transistor for applying the same values of current for each half of said cycle to the base-emitter path and to the collector-emitter path of said output transistor for driving the latter over the full cycle of said electric wave signal.

3. Integrated semiconductor current driver circuitry as defined in claim 2 and wherein said emitter follower circuitry comprises a first transistor having a base electrode connected to the collector electrode of one of said pair of current switch transistors, having a collector electrode connected to said fixed energizing potential applying circuitry and having an emitter electrode, a second transistor having a base electrode connected to the collector electrode of the other of said pair of current switch transistors, having a collector electrode connected to the collector electrode of said first current switch transistor, and having an emitter electrode, a diode having one electrode connected to said point of fixed reference potential and another electrode, a pair of resistors connected in series between said other electrode of said diode and the emitter electrode of said second transistor, a third transistor having a base electrode connected to said other electrode of said diode, having an emitter electrode connected to said point of fixed reference potential, and having a collector electrode connected to said base electrode of said output transistor, another diode connected between the junction of said pair of resistors and said collector electrode of said third transistor, another pair of resistors connected in series between said emitter electrode of said first transistor and said collector electrode of said third transistor, and a further diode connected between the junction of said other pair of resistors and said collector electrode of said output transistor.

4. Integrated semiconductor current driver circuitry comprising signal input terminals at which an electric wave signal is applied, output terminals at which a utilization circuit is connected to be driven in accordance with said electric wave signal, an output transistor having a collector electrode and another electrode individually connected to said output terminals, and having a further electrode, one emitter follower circuit comprising one transistor having a base electrode, having a collector electrode connected to a point of fixed energizing potential and having an emitter electrode, a clamping diode having a cathode electrode connected to a point of fixed reference potential and having an anode electrode, and one pair of resistors connected in series between said emitter electrode and said anode electrode of said diode, another emitter follower circuit comprising another transistor having a base electrode, having a collector electrode connected to said point of fixed energizing potential and having an emitter electrode, a further transistor having a base electrode connected to the anode electrode of said clamping diode, having an emitter electrode connected to said point of fixed reference potential and having a collector electrode, and another pair of resistors connected in series between said collector electrode of said further transistor and said emitter electrode of said other transistor, one diode connected between the junction of said other pair of resistors and said collector electrode of said output transistor, an electric connection between said further electrode of said output transistor and said collector electrode of said further transistor, another diode connected between the junction of said one pair of resistors and said further electrode of said output transistor, a current switching circuit having a pair of complementary output terminals individually connected to said base electrodes of said one and said other transistors, having a reference input terminal connected to a source of reference fixed potential, and having an input terminal, and electric connections between said input terminal of said current switching circuit and one said signal input terminals with the other of said input terminals connected to said point of fixed reference potential.

5. Integrated semiconductor current driver circuitry as in claim 4, and wherein
said other and said further electrodes of said output transistor are emitter and base electrodes respectively.

6. Integrated semiconductor current driver circuitry as in claim 4, and incorporating
input emitter follower circuitry interposed in said electric connections between said input terminal of said current switching circuit and said one signal input terminal.

7. Integrated semiconductor current driver circuitry as defined in claim 4, and wherein
said diode of said one emitter follower circuit and said further transistor of said other emitter follower circuit are arranged as a current mirror.

8. Integrated semiconductor current driver circuitry as defined in claim 4, and wherein
said one diode is in circuit with a further resistor across the base and collector electrodes of said output transistor for preventing saturation of the latter.

* * * * *